United States Patent [19]

Kusakabe

[11] Patent Number: 5,406,097

[45] Date of Patent: Apr. 11, 1995

[54] AVALANCHE PHOTO-DIODE FOR PRODUCING SHARP PULSE SIGNAL

[75] Inventor: Atsuhiko Kusakabe, Tokyo, Japan

[73] Assignee: NEC Corporation, Tokyo, Japan

[21] Appl. No.: 161,579

[22] Filed: Dec. 6, 1993

[30] Foreign Application Priority Data

Dec. 4, 1992 [JP] Japan .................. 4-350681

[51] Int. Cl.⁶ .............. H01L 27/14; H01L 31/00; H01L 29/161
[52] U.S. Cl. .................. 257/186; 257/196; 257/438; 257/459; 257/461
[58] Field of Search ............. 257/186, 196, 199, 438, 257/459, 461

[56] References Cited

U.S. PATENT DOCUMENTS

| | | | |
|---|---|---|---|
| 5,057,891 | 10/1991 | Torikai | 357/13 |
| 5,144,381 | 9/1992 | Furuyama et al. | 257/438 |
| 5,204,579 | 4/1993 | Tsuji et al. | 257/438 |
| 5,281,844 | 1/1994 | Funaba | 257/438 |

FOREIGN PATENT DOCUMENTS 0343970 11/1989 European Pat. Off. .
0373752 6/1990 European Pat. Off. .
62-205673 9/1987 Japan .

OTHER PUBLICATIONS

Patent Abstracts of Japan, vol. 13, No. 110 (E-728), Mar. 16, 1989.

Primary Examiner—Nâgn V. Ngô
Attorney, Agent, or Firm—Sughrue, Mion, Zinn, Macpeak & Seas

[57] ABSTRACT

An avalanche photo-diode in the InP-InGaAs-InGaAsP system has a thin main photo-absorbing layer for converting light into carriers, and an auxiliary photo-absorbing layer and a protection layer are provided under the main photo-absorbing structure for absorbing residue of the light without attracting toward electrodes, thereby producing an photo-detecting signal with a sharp trailing edge.

8 Claims, 4 Drawing Sheets

AVALANCHE PHOTO-DIODE FOR PRODUCING SHARP PULSE SIGNAL

FIELD OF THE INVENTION

This invention relates to an avalanche photo-diode available for an optical instrument and an optical communication system and, more particularly, to an avalanche photo-diode for producing a sharp pulse signal.

DESCRIPTION OF THE RELATED ART

The avalanche photo-diode per se serves as an amplifier in an optical instrument and an optical communication system, and germanium and indium-gallium-arsenide are available for the avalanche photo-diodes at wavelength of 1.3 microns and 1.55 microns.

Fig.1 illustrates a typical example of the avalanche photo-diode formed of germanium, and comprises a substrate 1, a photo-incident region 2 defined in a surface portion of the substrate 1, a guard ring 3 of partially overlapped with the outer periphery of the photo-incident region 2, a transparent passivation film 4 covering the surface of the substrate 1 and electrodes held in contact with the photo-incident region 2 and the reverse surface of the substrate 1. The substrate 1 is formed of n-type germanium, and boron is implanted into the surface portion for the photo-incident region 2. The guard ring 3 is formed through a thermal diffusion of zinc, and the transparent passivation film 4 is deposited by using a chemical vapor deposition.

In operation, the p-n junction between the substrate 1 and the photo-incident region 2 is reversely biased so as to extend a depletion layer therefrom, and incident light produces electron-hole pairs in the depletion layer. The carriers thus produced in the presence of the photon are accelerated in the electric field created in the depletion layer, and electric current flows between the electrodes 5 and 6.

Turning to FIG. 2 of the drawings, another prior art avalanche photo-diode in the InP-InGaAs-InGaAsP system is illustrated. The prior art avalanche photo-diode is fabricated on a substrate of heavily doped n-type indium phosphide, and comprises a buffer layer 12, a photo-absorbing layer 13, an intermediate layer 14, a multiplication layer 15, a window layer 16 with a photo-incident region 16a, transparent passivation film 17 and electrodes 18 and 19 respectively held in contact with the photo-incident region 16a and the reverse surface of the substrate 11.

The buffer layer 12 to the wind layer 16 are epitaxially grown on the substrate 11 through a vapor phase epitaxy, and are formed of n-type indium phosphide doped at $1 \times 10^{15}$ to $2 \times 10^{16}$ cm$^{-3}$, n-type indium gallium arsenide doped at $1 \times 10^{14}$ to $1 \times 10^{16}$ cm$^{-3}$, n-type indium gallium arsenic phosphide doped at $1 \times 10^{15}$ to $1 \times 10^{16}$ cm$^{-3}$, n-type indium phosphide doped at $2 \times 10^{16}$ to $4 \times 10^{16}$ cm$^{-3}$ and n-type indium phosphide doped at $1 \times 10^{15}$ to $8 \times 10^{15}$ cm$^{-3}$. In this instance, the buffer layer 12 to the wind layer 16 are 1 to 3 microns thick, 1 to 5 microns thick, 0.3 to 1.0 micron thick, 0.8 to 4.0 micron thick and 1 to 2 microns thick, respectively.

The photo-incident region 16a is formed through a diffusion of zinc, and is doped at the $1 \times 10^{17}$ to $1 \times 10^{20}$ cm$^{-3}$. A guard ring 20 is partially overlapped with the photo-incident region 16a, and is formed through an ion-implantation of beryllium.

In operation, the p-n junction between the photo-incident region 16a and the multiplication layer 15 is reversely biased so that a depletion layer extends from the p-n junction into the photo-absorbing layer 13. The depleted photo-absorbing layer 13 produces electron-hole pairs in the presence of incidental light at the wavelength not greater than 1.67 microns equivalent to the band-gap of indium gallium arsenide, and the carriers are accelerated in the electric field ranging between 20 to 100 kV/cm created in the depleted photo-absorbing layer 13. The carriers reach the saturation velocity by the agency of the strong electric field, and current flows between the electrodes 18 and 19.

The intermediate layer 506 features the prior art avalanche photo-diode shown in FIG. 2, and makes the discontinuity between the valence band of the photo-absorbing layer 13 of indium gallium arsenide and the valence band of the multiplication layer 15 of indium phosphide smooth. For this reason, the smooth valence band prevents the avalanche photo-diode from holes liable to be accumulated at the discontinuity, and allows the avalanche photo-diode to produce a sharp leading edge of a photo-detecting signal.

The prior art avalanche photo-diodes are available for an optical-time-domain-reflectometer, and the optical-time-domain-reflectometer detects a reflection due to the Rayleigh scattering for a trouble shooting with an optical fiber. If an optical fiber is broken, the light propagated along the optical fiber is reflected at the broken point, and the reflection returns to the entrance of the optical fiber. The optical-time-domain-reflectometer provided at the entrance converts the reflection into an electric pulse signal, and an analyst determines the broken point on the basis of a lapse of time between an emission of light pulse and the detected reflection.

The optical-time-domain-reflectometer is coupled with the optical fiber by means of a connector unit, and the connector unit produces a Fresnel diffraction. After a light pulse of, for example, 100 nanometer is emitted, the Fresnel diffraction is firstly detected by the optical-time-domain-reflectometer, and the Rayleigh reflection, thereafter, arrives thereat. In general, the Fresnel diffraction is much stronger than the Rayleigh reflection, and the optical-time-domain-reflectometer can not discriminate the Rayleigh reflection during the Fresnel diffraction and the pulse decay of the electric pulse signal indicative of the Fresnel diffraction. This means that there is a dead zone in the vicinity of the entrance of the optical fiber, and any broken point in the dead zone can not be found by the optical-time-domain-reflectometer, One of the approaches is to make the trailing edge of the electric pulse signal sharp, and a decreased pulse decay time shrinks the dead zone.

FIG. 3 shows response characteristics of the prior art avalanche photo-diodes, and Plots Ge and InGaAs are respectively indicative of the response characteristic of the avalanche photo-diode of germanium and the response characteristic of the avalanche photo-diode in the InP-InGaAs-InGaAsP system.

The avalanche photo-diode of germanium is relatively short in decay time rather than the avalanche photo-diode in the InP-InGaAs-InGaAsP system. However, the gentle decay of the avalanche photo-diode of germanium starts at a relatively large intensity rather than the avalanche photo-diode of the InP-InGaAs-InGaAsP system.

SUMMARY OF THE INVENTION

It is therefore an important object of the present invention provide an avalanche photo-diode which produces an electric pulse signal with a short decay time.

The present inventor analyzed the response characteristics of the prior art avalanche photo-diodes, and found that the above described tendencies were derived from structural differences between the avalanche photo-diode of germanium and the avalanche photo-diode in the InP-InGaAs-InGaAsP system. Namely, the avalanche photo-diode in the InP-InGaAs-InGaAsP system absorbed light in the photo-absorbing layer 13 only, and only a negligible amount of time delay took place between the carriers in the vicinity of the intermediate layer 14 and the carriers in the vicinity of the buffer layer 12. Therefore, the sharp trailing edge continued to a relatively small intensity. However, the thin photo-absorbing layer 13 allowed part of the light to be reflected at the electrode 19, and the scattered reflection was absorbed outside the depletion layer. This resulted in the gentle sloop from the relatively small intensity.

On the other hand, the prior art-avalanche photo-diode of germanium absorbed light in the whole substrate 1, and the carrier transit time was widely different depending upon the point where the carriers were produced. However, the reflection at the electrode 6 hardly took place, and the response characteristic was opposite to that of the avalanche photo-diode in the InP-InGaAs-InGaAsP system.

The present inventor concluded that reduction of the reflection would achieve a sharp trailing edge.

To accomplish the object, the present invention proposes to absorb residual light passing through a photo-absorbing layer before a reflection.

In accordance with the present invention, there is provided an avalanche photo-diode fabricated on a semiconductor substrate structure for converting light into electric current, comprising: a) an auxiliary photo-absorbing layer formed on the substrate structure and operative to convert residue of the light into carriers recombined without participating in said current; b) a transparent protection layer formed on the auxiliary photo-absorbing layer and operative to reduce an electric field in the auxiliary photo-absorbing layer; c) a transparent main photo-absorbing structure formed on the transparent protection layer and operative to convert most of the light into carriers serving as the current in the depletion layer extending thereinto; d) a transparent multiplication layer formed on the transparent main photo-absorbing structure and operative to increase the carriers passing therethrough; e) a transparent window layer formed on the transparent multiplication layer and having a photo-incident region for forming a p-n junction; and f) a pair of electrodes operative to create the electric field for causing the depletion layer extending from the p-n junction into the main photo-absorbing structure.

BRIEF DESCRIPTION OF THE DRAWINGS

The feature and advantages of the avalanche photo-diode according to the present invention will be more clearly understood from the following description taken in conjunction with the accompanying drawings in which.

DESCRIPTION OF THE PREFERRED EMBODIMENTS

First Embodiment

Figure 1:
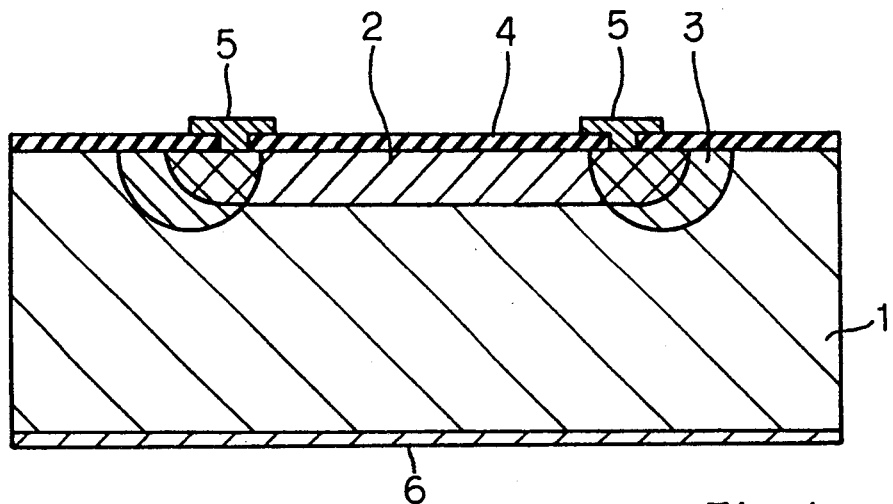
FIG. 1 is a cross sectional view showing the structure of the prior art avalanche photo-diode of germanium.
Figure 2:
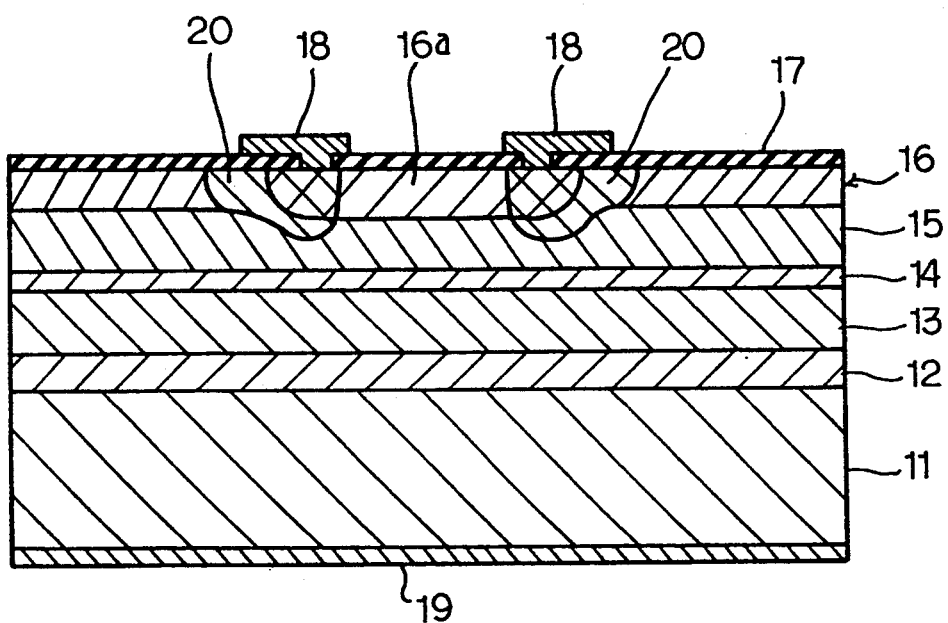
FIG. 2 is a cross sectional view showing the structure of the prior art avalanche photo-diode in the InP-InGaAs-InGaAsP system.
Figure 3:
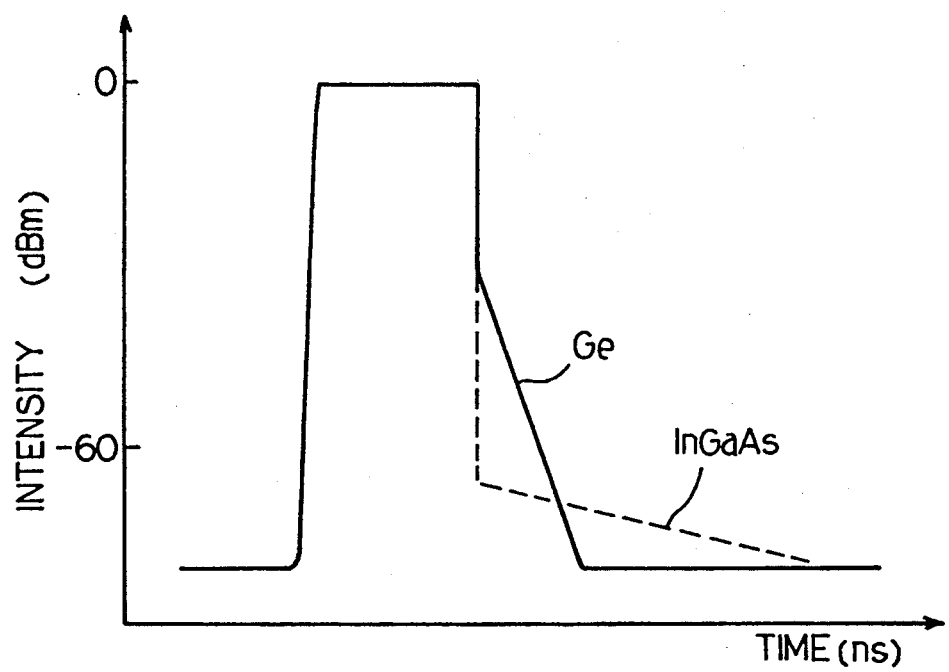
FIG. 3 is a graph showing the response characteristics of the prior art avalanche photo-diodes.
Figure 4:
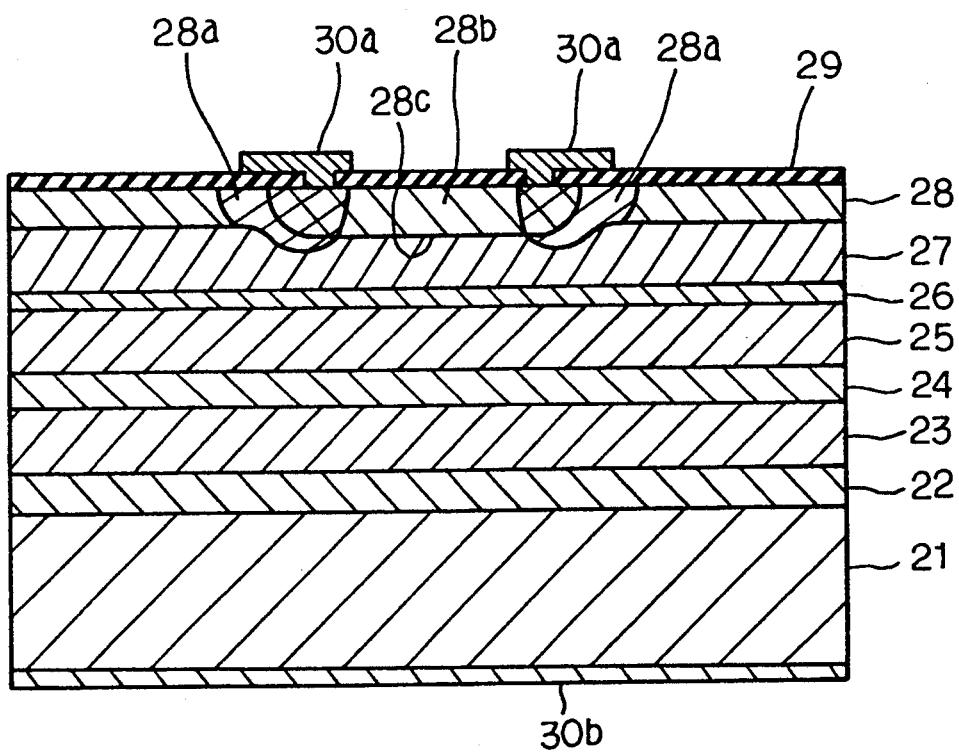
FIG. 4 is a cross sectional view showing the structure of an avalanche photo-diode according to the present invention.

Referring to FIG. 4 of the drawings, an avalanche photo-diode embodying the present invention is fabricated on a substrate 21 of heavily doped n-type indium phosphide, and comprises a buffer layer 22 of n-type indium phosphide, an auxiliary photo-absorbing layer 23 of n-type indium gallium arsenide, a protection layer 24 of n-type indium phosphide, a main photo-absorbing layer 25 of n-type indium gallium arsenide, an intermediate layer 26 of n-type indium gallium arsenic phosphide, a multiplication layer 27 of n-type indium phosphide and a window layer 28 of n-type indium phosphide.

The buffer layer 22 is doped at $1 \times 10^{15}$, and is 2 microns in thickness. The dopant concentration of the buffer layer 22 may range from $1 \times 10^{15}$ to $2 \times 10^{16}$ cm$^{-3}$, and the thickness of the buffer layer 22 may range from 1 micron to 3 microns.

The auxiliary photo-absorbing layer 23 is doped at $5 \times 10^{15}$, and is 4 microns in thickness. The dopant concentration of the auxiliary photo-absorbing layer 23 may range from $1 \times 10^{15}$ to $2 \times 10^{16}$ cm$^{-3}$, and the thickness of the auxiliary photo-absorbing layer 23 may range from 2 microns to 5 microns.

The protection layer 24 is doped at $2 \times 10^{16}$, and is 3 microns in thickness. The dopant concentration of the protection layer 24 may range from $1 \times 10^{16}$ to $3 \times 10^{16}$ cm$^{-3}$, and the thickness of the protection layer 24 may range from 2 microns to 5 microns.

The main photo-absorbing layer 25 is doped at $3 \times 10^{15}$, and is 4 microns in thickness. The dopant concentration of the main photo-absorbing layer 25 may range from $1 \times 10^{15}$ to $5 \times 10^{15}$ cm$^{-3}$, and the thickness of the main photo-absorbing layer 25 may range from 3 microns to 4 microns.

The intermediate layer 26 is doped at $1 \times 10^{16}$ and is 0.5 micron in thickness. The dopant concentration of the intermediate layer 26 may range from $3 \times 10^{15}$ to $1 \times 10^{16}$ cm$^{-3}$, and the thickness of the intermediate layer 26 may range from 0.03 micron to 0.5 micron.

The multiplication layer 27 is doped at $3 \times 10^{16}$ and is 1.4 microns in thickness. The dopant concentration of the multiplication layer 27 may range from $1 \times 10^{16}$ to $4 \times 10^{16}$ cm$^{-3}$, and the thickness of the multiplication layer 27 may range from 0.5 micron to 3 microns.

The window layer 28 is doped at $5 \times 10^{15}$, and is 1.4 micron in thickness. The dopant concentration of the window layer 28 may range from $2 \times 10^{15}$ to $6 \times 10^{15}$ cm$^{-3}$, and the thickness of the window layer 28 may range from 1 micron to 2 microns.

In this instance, the semiconductor substrate 21 and the buffer layer 22 form in combination a substrate structure, and the main photo-absorbing layer 25 and the intermediate layer 26 as a whole constitute a transparent main photo-absorbing structure.

The avalanche photo-diode embodying the present invention further comprises a guard ring 28a doped with beryllium, a photo-incident region 28b partially overlapped with the guard ring 28a and doped with zinc at $1 \times 10^{17}$ to $1 \times 10^{20}$ cm$^{-3}$, a transparent passivation film 29 and electrodes 30a and 30b held in contact with the photo-incident region 28b and the reverse surface of the semiconductor substrate 21. The electrode 30a is formed of gold-zinc alloy, and the other electrode 30b is formed of gold-tin alloy.

When the electrodes 30a and 30b are appropriately biased, a depletion layer extends from a p-n junction 28c through the multiplication layer 27 and the intermediate layer 26 into the main photo-absorbing layer 25. However, the depletion layer does not reach the auxiliary photo-absorbing layer 23. For this reason, electron-hole pairs produced in the main photo-absorbing layer 25 can participate in current flowing between the electrodes 30a and 30b. However, electron-hole pairs produced in the auxiliary photo-absorbing layer 23 are recombined without participating in the current.

The reverse bias produces an electric field, and the strength of the electric field ranges from 50 to 200 kV/cm around the boundary between the intermediate layer 26 and the main photo-absorbing layer 25. In this situation, the electric field is negligible in the protection layer 24, and any electric field takes place in the auxiliary photo-absorbing layer 23.

The intermediate layer 26 makes the discontinuity of the valence bands between the multiplication layer 27 and the main photo-absorbing layer 25, and evacuates accumulated holes therefrom. As a result, an electric pulse signal is improved in pulse rise time.

The avalanche photo-diode is fabricated on the semiconductor substrate 21 through a process sequence as follows. The process starts with preparation of the semiconductor substrate 21, and the buffer layer 22 to the window layer 28 are grown on the semiconductor substrate 21 in a vapor phase epitaxy.

A silicon dioxide film is deposited over the entire surface of the window layer 28 through a chemical vapor deposition, and is patterned through a lithographic process into a mask (not shown). The mask exposes a ring-shaped area of the window layer 28 to beryllium, and the guard ring 28a is formed in the window layer 28.

A new appropriate mask (not shown) is formed on the window layer 28, and zinc is diffused into the window layer 28 in such a manner as to be partially overlapped with the guard ring 28a. The zinc thus diffused defines the photo-incident region 28b in the window layer 28.

The surface of the window layer 28 is exposed, and an appropriate insulating substance is deposited on the exposed surface for providing the transparent passivation layer 29.

A ring-shaped contact hole is formed in the transparent passivation layer 29 through a lithographic process, and gold-zinc alloy is grown from the exposed ring-shaped area over the transparent passivation film 29.

The back surface of the semiconductor substrate 21 is grinded until the thickness of 100 to 200 microns, and gold-tin alloy is evaporated on the grinded back surface of the semiconductor substrate 21.

In operation, the electrodes 30a and 30b are biased so that the electric field of 50 to 200 kV/cm takes place around the boundary between the intermediate layer 26 and the main photo-absorbing layer 25. The strength of the electric field under the bias condition is approximately zero in the auxiliary photo-absorbing layer 23, and the depletion layer from the p-n junction 28c is terminated in the main photo-absorbing layer 25.

Figure 5:
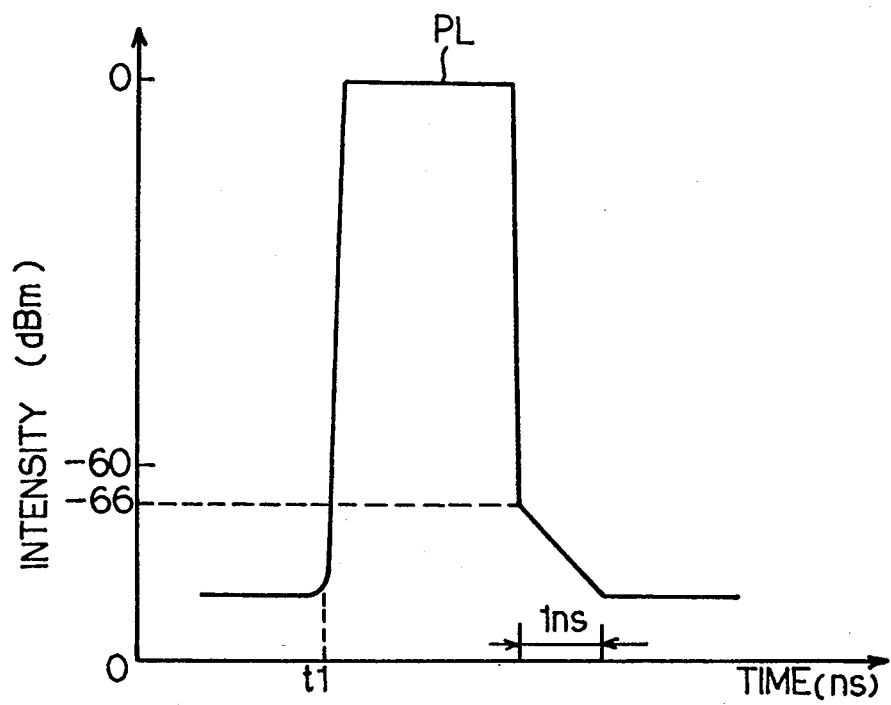
FIG. 5 is a graph showing the response characteristic of the avalanche photo-diode according to the present invention.

A light pulse is incident on the photo-incident region 28b and reaches the main photo-absorbing layer 25. The light supplies energy to the main photo-absorbing layer 25, and the main photo-absorbing layer 25 absorbs the light at 95 per cent. As a result, electron-hole pairs are produced in the main photo-absorbing layer 25, and the carriers, i.e., the electrons and holes are accelerated in the large electric field. The carriers are detectable as electric current, and the electric pulse signal PL rises at time t1 of FIG. 5. By virtue of the intermediate layer 26, the leading edge of the electric pulse signal PL is extremely sharp.

The residue of light passes through the main photo-absorbing layer 25, and reaches the auxiliary photo-absorbing layer 23. The residue of light supplies energy to the auxiliary photo-absorbing layer 23, and electron-hole pairs are produced again. In this instance, the residue of light is converted into the carriers at 95 per cent. However, the carriers produced in the auxiliary photo-absorbing layer 23 are not attracted toward the electrodes, because any substantial electric field is not created in the auxiliary photo-absorbing layer 23. While staying in the auxiliary photo-absorbing layer 23, the electrons and the holes are rapidly recombined, because the auxiliary photo-absorbing layer 23 is not depleted. For this reason, the carriers produced in the auxiliary photo-absorbing layer 23 does not participate in the current between the electrodes 30a and 30b, and the thin main photo-absorbing layer 25 creates a sharp trailing edge in cooperation with the auxiliary photo-absorbing layer 23. In fact, the trailing edge of the electric pulse signal PL abruptly reach $-66$ dBm, and a gentle sloop takes place only 1 nanosecond.

The residue of light passes through the auxiliary photo-absorbing layer 23 at 5 per cent, and is reflected on the electrode 30b. The reflection are absorbed in the auxiliary photo-absorbing layer 23, and any substantial light is not incident in the main photo-absorbing layer 25 from the back surface of the semiconductor substrate 21.

As will be appreciated from the foregoing description, the auxiliary photo-absorbing layer 23 effectively absorbs the residue of light, and the avalanche photo-diode according to the present invention produces the electric pulse signal with the sharp trailing edge.

If the avalanche photo-diode according to the present invention is incorporated in the optical-time-domain-reflectometer, the optical-time-domain-reflectometer can check an optical fiber to see whether or not a broken point takes place along most of the passage, and the dead zone is effectively decreased.

Second Embodiment

Figure 6:
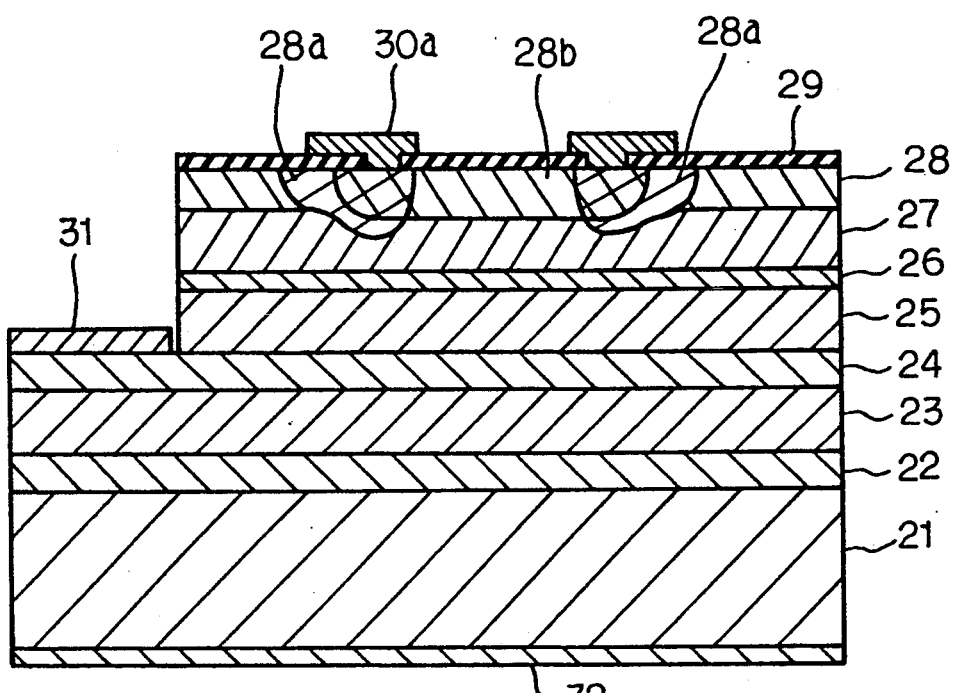
FIG. 6 is a cross sectional view showing the structure of another avalanche photo-diode according to the present invention.

Turning to FIG. 6 of the drawings, another avalanche photo-detector embodying the present invention is illustrated. The avalanche photo-detector implementing the second embodiment is similar in structure to the first embodiment except for an electrode 31 and a gold film 32 for bonding. For this reason, layers and regions of the second embodiment are labeled with the same references as those of the first embodiment without detailed description for the sake of simplicity.

The main photo-absorbing layer 25, the intermediate layer 26, the multiplication layer 27 and the window layer 28 are partially removed, and the electrode 31 is directly contacted with the protection layer 24. A bias voltage is applied between the electrodes 30a and 31, and the auxiliary photo-absorbing layer 23 is located outside of the electric field created by the bias voltage.

The avalanche photo-diode implementing the second embodiment achieves a good response characteristic as similar to the first embodiment.

Although particular embodiments of the present invention have been shown and described, it will be obvious to those skilled in the art that various changes and modifications may be made without departing from the spirit and scope of the present invention. For example, the buffer layer to the window layer may be grown through a liquid phase epitaxy, and a metal organic chemical vapor deposition, a molecular beam epitaxy and an atomic layer epitaxy are available for the epitaxial growth.

The embodiments are in the InP-InGaAs-InGaAsP system. However, another compound semiconductor system may be used for the avalanche photo-diode according to the present invention, and the multiplication layer may have a super-lattice structure. If the super-lattice structure is used, it is desirable not to absorb incident light.

What is claimed is:

1. An avalanche photo-diode fabricated on a semiconductor substrate structure for converting light into electric current, comprising:
    a) an auxiliary photo-absorbing layer formed on said substrate structure and operative to convert residue of said light into carriers, said carriers being recombined without participating in said current;
    b) a transparent protection layer formed on said auxiliary photo-absorbing layer and operative to reduce an electric field in said auxiliary photo-absorbing layer;
    c) a transparent main photo-absorbing structure formed on said transparent protection layer and operative to convert most of said light into carriers serving as said current in said depletion layer extending thereinto;
    d) a transparent multiplication layer formed on said transparent main photo-absorbing structure and operative to increase the carriers passing therethrough;
    e) a transparent window layer formed on said transparent multiplication layer and having a photo-incident region for forming a p-n junction; and
    f) a pair of electrodes operative to create said electric field for causing said depletion layer extending from said p-n junction into said main photo-absorbing structure.

2. The avalanche photo-diode as set forth in claim 1, in which said semiconductor substrate structure comprises a semiconductor substrate of a first conductivity type and a buffer layer of said first conductivity type.

3. The avalanche photo-diode as set forth in claim 1, in which said transparent main photo-absorbing structure comprises a main photo-absorbing layer formed on said protection layer and an intermediate layer formed between said main photo-absorbing layer and said multiplication layer for making a discontinuity of energy bands between said main photo-absorbing layer and said multiplication layer gentle, thereby rapidly evacuating said carriers produced in said transparent main photo-absorbing layer.

4. The avalanche photo-diode as set forth in claim 3, in which said semiconductor substrate structure, said auxiliary photo-absorbing layer, said protection layer, said main photo-absorbing layer, said intermediate layer, said multiplication layer and said window layer are respectively formed of indium phosphide of a first conductivity type, indium gallium arsenide of said first conductivity type, indium phosphide of said first conductivity type, indium gallium arsenide of said first conductivity type, indium gallium arsenic phosphide of said first conductivity type, indium phosphide of said first conductivity type and indium phosphide of said first conductivity type.

5. The avalanche photo-diode as set forth in claim 4, in which one of said electrodes is held in contact with said photo-incident region of a second conductivity type opposite in said first conductivity type, and the other of said electrodes is held in contact with a back surface of said semiconductor substrate structure.

6. The avalanche photo-diode as set forth in claim 5, in which said photo-incident region of said second conductivity type has an outer periphery partially overlapped with a guard ring of said second conductivity type.

7. The avalanche photo-diode as set forth in claim 4, in which said main photo-absorbing layer has a first predetermined thickness for absorbing said light at 95 percent, and said auxiliary photo-absorbing layer has a second predetermined thickness for absorbing said residue of said light at 95 percent.

8. The avalanche photo-diode as set forth in claim 1, in which one of said electrodes is held in contact with said photo-incident region, and the other of said electrodes is held in contact with said protection layer so as to remove said electric field from said auxiliary photo-absorbing layer.

* * * * *